United States Patent
Higo et al.

(10) Patent No.: US 6,831,314 B2
(45) Date of Patent: Dec. 14, 2004

(54) MAGNETORESISTIVE EFFECT ELEMENT AND MAGNETIC MEMORY DEVICE

(75) Inventors: Yutaka Higo, Miyagi (JP); Masanori Hosomi, Miyagi (JP); Kazuhiro Ohba, Miyagi (JP); Takeyuki Sone, Miyagi (JP); Kazuhiro Bessho, Kanagawa (JP); Tetsuya Yamamoto, Kanagawa (JP); Tetsuya Mizuguchi, Kanagawa (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/606,097

(22) Filed: Jun. 25, 2003

(65) Prior Publication Data

US 2004/0001372 A1 Jan. 1, 2004

(30) Foreign Application Priority Data

Jun. 26, 2002 (JP) .................................... P2002-186791

(51) Int. Cl.[7] .............................................. H01L 29/76
(52) U.S. Cl. ...................... 257/295; 257/298; 257/303; 257/306; 257/324; 438/3; 438/240
(58) Field of Search ................... 257/68, 71, 295–314, 257/324–326; 438/3, 240

(56) References Cited

U.S. PATENT DOCUMENTS 6,090,480 A * 7/2000 Hayashi ...................... 428/332
6,671,136 B2 * 12/2003 Arai et al. ................... 360/321
6,730,949 B2 * 5/2004 Kishi et al. .................. 257/295
2002/0036876 A1 * 3/2002 Kawawake et al. ....... 360/324.1

* cited by examiner

*Primary Examiner*—David Nelms
*Assistant Examiner*—Andy Huynh
(74) *Attorney, Agent, or Firm*—Sonnenschein, Nath & Rosenthal LLP

(57) ABSTRACT

A magnetoresistive effect element (1) has an arrangement in which a pair of ferromagnetic material layers (magnetization fixed layer (5) and magnetization free layer (7)) is opposed to each other through an intermediate layer (6) to obtain a magnetoresistive change by causing a current to flow in the direction perpendicular to the layer surface, the magnetization free layer (7) is made of a ferromagnetic material containing FeCoB or FeCoNiB and the magnetization free layer (7) has a film thickness ranging from 2 nm to 8 nm. A magnetic memory device comprises this magnetoresistive effect element (1) and bit lines and word lines sandwiching the magnetoresistive effect element (1) in the thickness direction. There are provided the magnetoresistive effect element having satisfactory magnetic characteristics and the magnetic memory device including this magnetoresistive effect element and which can obtain excellent write/read characteristics.

8 Claims, 6 Drawing Sheets

MAGNETORESISTIVE EFFECT ELEMENT AND MAGNETIC MEMORY DEVICE

BACKGROUND OF THE INVENTION

1. Field of the Invention

The present invention relates to a magnetoresistive effect element having an arrangement for obtaining a magnetoresistive change by causing a current to flow in the direction perpendicular to the layer surface and a magnetic memory device including this magnetoresistive effect element.

2. Description of the Related Art

As information communication devices, in particular, personal small information communication devices such as portable terminal devices (e.g. personal digital assistants) are widely spreading, it is requested that devices such as memories and logic devices comprising these information communication devices or portable terminal devices should become higher in performance, such as they should become higher in integration degree, they can operate at higher speed and they can consume lesser electric power. Particularly, technologies that can make nonvolatile memories become higher in density and larger in storage capacity are becoming more and more important as complementary technologies for replacing hard disk devices and optical disk devices with nonvolatile memories because it is essentially difficult to miniaturize hard disk devices and optical disk devices because they have their movable portions (e.g. head seek mechanism and head rotation mechanism).

Flash memories using semiconductors, an FRAM (ferro electric random-access memory) using a ferro dielectric material and so on are known as nonvolatile memories.

However, flash memories have a defect that the information writing speed thereof is slow as the order of microseconds. On the other hand, it has been pointed out that the FRAM cannot be rewritten so many times.

A magnetic memory device called an MRAM (magnetic random-access memory) device that had been described in "Wang et al., IEEE Trans. Magn. 33 (1997), 4498", receives a remarkable attention as a nonvolatile memory that can overcome these defects. This MRAM is simple in structure and therefore can be easily integrated at high integration degree and since the MRAM is able to record by rotation of magnetic moment, it can be rewritten a large number of times. Further, it is expected that the MRAM has very high access time and it has already been confirmed that the MRAM can be operated at speed in the order of nanoseconds.

A magnetoresistive effect element used in this MRAM and especially ferromagnetic tunnel junction (MTJ (magnetic tunnel junction)) is essentially composed of a laminated layer construction of a ferromagnetic material layer, a tunnel barrier layer and a ferromagnetic material layer. In this element, when an external magnetic field is applied to the ferromagnetic material layers under the condition in which a constant current flows through the ferromagnetic material layers, magnetoresistive effect appears in response to a relative angle of the magnetizations of the two ferromagnetic material layers. When the magnetization directions of the two ferromagnetic material layers are anti-parallel, a resistance value becomes the maximum. When the magnetization directions of the two ferromagnetic material layers are parallel to each other, a resistance value becomes the minimum. Functions of the memory element can be achieved when anti-parallel and parallel states are produced with application of external magnetic fields.

In particular, in a spin-valve type TMR element, one ferromagnetic material layer is coupled to an adjacent antiferromagnetic material layer in an antiferromagnetic fashion and thereby formed as a magnetization fixed layer whose magnetization direction is constantly made constant. The other ferromagnetic material layer is formed as a magnetization free layer whose magnetization direction is easily inverted with application of external magnetic fields and the like. Then, this magnetization free layer is formed as an information recording layer in a magnetic memory.

For the TMR element of a spin-valve structure, a changing ratio of a resistance value in the TMR element is expressed as the following equation (A) where P1, P2 represent spin polarizabilities of the respective ferromagnetic material layers:

$$2P1P2/(1-P1P2) \tag{A}$$

Accordingly, the changing ratio of the resistance value increases as the respective spin polarizabilities increase. With respect to a relationship between materials for use with the ferromagnetic material layers and this resistance change ratio, ferromagnetic elements of Fe group, such as Fe, Co, Ni and alloys of these three kinds of elements have been reported so far.

Fundamentally, the MRAM comprises a plurality of bit write lines (so-called bit lines), a plurality of word write lines (so-called word lines) and TMR elements disposed at intersection points between these bit write lines and word write lines as magnetic memory elements as shown in Japanese laid-open patent application No. 10-116490, for example. When information is to be written in such MRAM, information is selectively written in the TMR elements by using asteroid characteristics.

Bit write lines and word write lines for use with the MRAM are made of Cu or Al conductive thin films which are generally used in semiconductors. When information is written in the element by a write line having a width of 0.25 μm with application of inverted magnetic fields, for example, a current of approximately 2 mA was required. When the thickness of the write line is the same as the line width, a current density obtained at that time reaches $3.2 \times 10^6$ A/cm$^2$ and which is a limit value in breaking wires due to electro-migration. From a problem of heat generated by a write current and from a standpoint for decreasing power consumption, it is necessary to decrease this write current.

As a method for realizing decrease of the write current in the MRAM, there may be enumerated a method for decreasing coercive force of the TMR element. The coercive force of the TMR element is properly determined based upon suitable factors such as size and shape of element, film arrangement and selection of materials.

However, when the TMR element is microminiaturized in order to increase the recording density of the MRAM, for example, there arises a disadvantage in which the coercive force of the TMR element increases.

Accordingly, in order to microminiaturize the MRAM (to integrate the MRAM with high integration degree) and to decrease the write current at the same time, the coercive force of the TMR element should be decreased from a standpoint. of materials.

In the MRAM, when magnetic characteristics of the TMR elements fluctuate at every element or magnetic characteristics fluctuate when the same element is repeatedly used, there arises a problem in which it becomes difficult to selectively write information by using asteroid characteristics.

Accordingly, the TMR element is requested to have magnetic characteristics that can draw an ideal asteroid curve.

To draw an ideal asteroid curve, an R-H (resistance-magnetic field) loop obtained when magnetic characteristic of the TMR element are measured is free from noises such as a Barkhausen noise, a waveform should have an excellent rectangle property, the magnetization state should be stable and the coercive force Hc should be prevented from being fluctuated.

In order to read out information from the TMR element of the MRAM, information is read out from the TMR element by a difference current at a constant bias voltage and by a difference voltage at a constant bias current obtained in the condition in which the state of "1", for example, is presented when the directions of the magnetic moments of one ferromagnetic material layer and the other ferromagnetic material layer sandwiching the tunnel barrier layer are anti-parallel and resistance values are high and in which the state of "0" is presented when the directions of the magnetic moments are parallel to each other.

Accordingly, when the fluctuations of the resistance values between the elements are the same, a higher TMR ratio (magnetoresistive changing ratio) is advantageous so that a memory which is high in speed, high in integration degree and which is low in error rate can be realized.

It is known that a TMR element having a fundamental structure of ferromagnetic material layer/tunnel barrier layer/ferromagnetic material layer has a bias voltage dependence of a TMR ratio so that the TMR ratio decreases as the bias voltage increases. In most cases, since it is known that the TMR ratio takes the maximum value of the read signal at a voltage (Vh) that is reduced by half due to the bias voltage dependence, smaller bias voltage dependence is effective for decreasing read errors.

Accordingly, the TMR element for use with the MRAM should satisfy the necessary conditions of the above-mentioned write characteristics and read characteristics at the same time.

However, when the material of the ferromagnetic material layer of the TMR element is selected, if alloy compositions by which spin polarizabilities shown by P1 and P2 in the equation (A) are increased are selected from the materials which are made of only ferromagnetic transition metal elements of Co, Fe, Ni, then there is a tendency that the coercive force Hc of the TMR element generally increases.

When a magnetization free layer (free layer), i.e. an information recording layer is made of a Co75Fe25 (atomic percent) alloy and the like, although the spin polarizability is large and a high TMR ratio greater than 40% can be maintained, the coercive force Hc also increases.

On the other hand, when the magnetization free layer is made of an Ni80Fe20 (atomic percent) alloy that is called a permalloy known as a soft magnetic material, although the coercive force Hc can be decreased, since the spin polarizability is low as compared with the above-mentioned Co75Fe25 (atomic percent) alloy, the TMR ratio is lowered to approximately 33%.

Further, when the magnetization free layer is made of a Co90Fe10 (atomic percent) alloy that has an intermediate characteristic of the above-mentioned alloys having the two compositions, although a TMR ratio of approximately 37% can be obtained and the coercive force Hc can be suppressed to approximately an intermediate value between the coercive force Hc of the above-mentioned Co75Fe25 (atomic percent) alloy and the coercive force Hc of the above-mentioned Ni80Fe20 (atomic percent) alloy, the rectangle property of the R-H loop (resistance-magnetic field curve) is not satisfactory and an asteroid characteristic for making writing become possible cannot be obtained. Furthermore, a problem arises in which the inverted magnetic field of the magnetization free layer is not stabilized at every element.

SUMMARY OF THE INVENTION

An object of the present invention is to provide a magnetoresistive effect element that can obtain excellent magnetic characteristics.

It is another object of the present invention to provide a magnetic memory device including this magnetoresistive effect element and which can obtain excellent write/read characteristics.

According to an aspect of the present invention, there is provided a magnetoresistive effect element in which a pair of ferromagnetic material layers is opposed to each other through an intermediate layer to obtain a magnetoresistive change by causing a current to flow in the direction perpendicular to the layer surface. One of the ferromagnetic material layers is a magnetization fixed layer and the other of the ferromagnetic material layer is a magnetization free layer, the magnetization free layer is made of a ferromagnetic material containing FeCoB or FeCoNiB and the magnetization free layer has a film thickness ranging from 2 nm to 8 nm.

According to other aspect of the present invention, there is provided a magnetic memory device comprising a magnetoresistive effect element designed in such a manner that a ferromagnetic tunnel junction sandwiching a tunnel barrier layer is formed between a pair of ferromagnetic material layers to cause a current to flow in the direction perpendicular to the layer surface and word lines and bit lines sandwiching the magnetoresistive effect element in the thickness direction. One of the ferromagnetic material layers is a magnetization fixed layer and the other ferromagnetic material layers is a magnetization free layer, the magnetization free layer is made of a ferromagnetic material containing FeCoB or FeCoNiB and the magnetization free layer has a film thickness ranging from 2 nm to 8 nm.

According to the arrangement of the magnetoresistive effect element of the present invention, since the magnetization free layer is made of the ferromagnetic material containing FeCoB or FeCoNiB and the magnetization free layer has the film thickness ranging from 2 nm to 8 nm, it becomes possible to increase a magnetoresistive changing ratio (magnetoresistive ratio) and to improve a rectangle property of a resistance-magnetic field curve and fluctuations of a coercive force.

According to the arrangement of the magnetic memory device of the present invention, since the magnetic memory device includes the magnetoresistive effect element and the word lines and the bit lines sandwiching the magnetoresistive effect element in the thickness direction and the magnetoresistive effect element has the arrangement of the magnetoresistive effect element of the present invention, magnetic characteristics of the magnetoresistive effect element, such as the magnetoresistive ratio, the rectangle property of the resistance-magnetic field curve and the fluctuations of the coercive force can be improved and hence errors caused when information is written in and read out from the magnetic memory device can be decreased.

BRIEF DESCRIPTION OF THE DRAWINGS

FIGS. 9A to 9C are graphs showing a relationship between a film thickness and a magnetic characteristic obtained when the magnetization free layer is made of a material containing Fe9Co72B20, wherein FIG. 9A is a graph showing a relationship between the film thickness of the magnetization free layer and a TMR ratio, FIG. 9B is a graph showing a relationship between the film thickness of the magnetization free layer and a coercive force and FIG. 9C is a graph showing a relationship between the film thickness of the magnetization free layer and fluctuations of coercive force; and FIGS. 10A to 10C are graphs showing a relationship between a film thickness and a magnetic characteristic obtained when the magnetization free layer is made of a material containing Fe20Co60B20, wherein FIG. 10A is a graph showing a relationship between the film thickness of the magnetization free layer and a TMR ratio, FIG. 10B is a graph showing a relationship between the film thickness of the magnetization free layer and a coercive force and FIG. 10C is a graph showing a relationship between the film thickness of the magnetization free layer and fluctuations of coercive force.

DESCRIPTION OF THE PREFERRED EMBODIMENTS

The present invention will now be described with reference to the drawings. Before describing the preferred embodiment of the invention, let us summarize the present invention as follows.

According to the present invention, there is provided a magnetoresistive effect element in which a pair of ferromagnetic material layers is opposed to each other through an intermediate layer to obtain a magnetoresistive change by causing a current to flow in the direction perpendicular to the layer surface. One of the ferromagnetic material layers is a magnetization fixed layer and the other ferromagnetic material layer is a magnetization free layer, the magnetization free layer is made of a ferromagnetic material containing FeCoB or FeCoNiB and the magnetization free layer has a film thickness ranging from 2 nm to 8 nm.

According to the present invention, in the magnetoresistive effect element, the magnetoresistive effect element is a tunnel magnetoresistive effect element using a tunnel barrier layer made of an insulating or semiconductor material as the intermediate layer.

According to the present invention, in the magnetoresistive effect element, the magnetoresistive effect element has a laminated ferri structure.

According to the present invention, there is provided a magnetic memory device comprising a magnetoresistive effect element designed in such a manner that a ferromagnetic tunnel junction sandwiching a tunnel barrier layer is formed between a pair of ferromagnetic material layers to cause a current to flow in the direction perpendicular to the layer surface and word lines and bit lines sandwiching the magnetoresistive effect element in the thickness direction. One of the ferromagnetic material layers is a magnetization fixed layer and the other ferromagnetic material layer is a magnetization free layer, the magnetization free layer is made of a ferromagnetic material containing FeCoB or FeCoNiB and the magnetization free layer has a film thickness ranging from 2 nm to 8 nm.

Further, according to the present invention, in the magnetic memory device, the magnetoresistive effect element is a tunnel magnetoresistive effect element using a tunnel barrier layer made of an insulating or semiconductor material as the intermediate layer.

Furthermore, according to the present invention, in the magnetic memory device, the magnetoresistive effect element has a laminated ferri structure.

Figure 1:
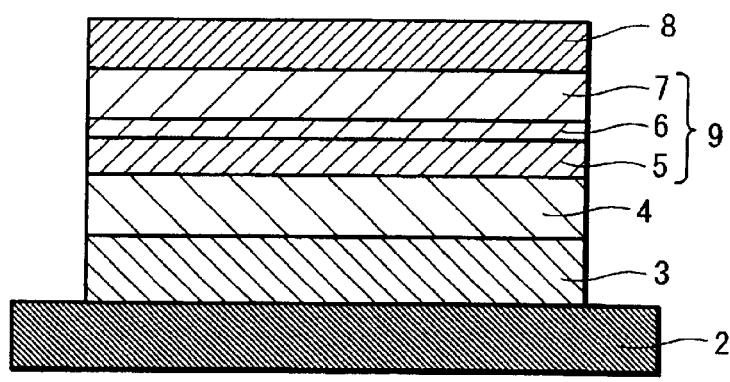
FIG. 1 is a schematic diagram showing an arrangement of a TMR element according to an embodiment of the present invention.

FIG. 1 of the accompanying drawings is a schematic diagram showing an arrangement of a magnetoresistive effect element according to the present invention. This embodiment shown in FIG. 1 shows the case in which the present invention is applied to a tunnel magnetoresistive effect element (hereinafter referred to as a "TMR element").

This TMR element 1 comprises a substrate 2 made of a suitable material such as silicon on which there are laminated an underlayer 3, an antiferromagnetic material layer 4, a magnetization fixed layer 5 serving as a ferromagnetic material layer, a tunnel barrier layer 6, a magnetization free layer 7 serving as a ferromagnetic material layer and a top-coat layer 8, in that order.

Specifically, this TMR element is a so-called spin-valve type TMR element in which one of the ferromagnetic material layers is formed as the magnetization fixed layer 5 and the other ferromagnetic material layer is formed as the magnetization free layer 7. A ferromagnetic tunnel junction 9 is formed by sandwiching the tunnel barrier layer 6 with the magnetization fixed layer 5 and the magnetization free layer 7 that serve as a pair of ferromagnetic material layers.

Then, when this TMR element is applied to a magnetic memory device and the like, the magnetization free layer 7 is formed as an information recording layer in which information may be recorded.

The antiferromagnetic material layer 4 is the layer in which when the antiferromagnetic material layer 4 is coupled to the magnetization fixed layer 5 serving as one of the ferromagnetic material layers in an antiferromagnetic fashion, the magnetization direction of the magnetization fixed layer 5 can be prevented from being inverted with application of a write current magnetic field so that the magnetization direction of the magnetization fixed layer 5 can be made constant constantly. Specifically, in the TMR element 1 shown in FIG. 1, the magnetization direction of only the magnetization free layer 7 that is the other ferromagnetic material layer is inverted with application of external magnetic fields and the like. Since the magnetization free layer 7 becomes the layer in which information is recorded when the TMR element 1 is applied to a suitable device such as a magnetic memory device, this magnetization free layer 7 is referred to as an "information recording layer".

As a material that comprises the antiferromagnetic material layer 4, there can be used Mn alloy containing Fe, Ni, Pt, Ir, Rh and the like, Co oxide, Ni oxide and the like.

The ferromagnetic material comprising the magnetization fixed layer 5 is not limited in particular and made of an alloy material composed of one or more than two of iron, nickel and cobalt.

In the spin-valve type TMR element 1 shown in FIG. 1, the magnetization free layer 5 is coupled to the antiferromagnetic material layer 4 in an antiferromagnetic fashion and thereby the magnetization direction thereof is made constant. Therefore, the magnetization direction of the magnetization fixed layer 5 can be prevented from being inverted with application of a current magnetic field used when information is written.

The tunnel barrier layer 6 is a layer that can magnetically separate the magnetization fixed layer 5 and the magnetization free layer 7 from each other and through which a tunnel current can flow.

As a material comprising the tunnel barrier layer 6, there can be used oxides such as Al, Mg, Si, Li, Ca, nitride, an insulating material such as halide.

Such tunnel barrier layer 6 can be obtained by oxidizing or nitriding a metal film that has been deposited by a suitable method such as sputtering or vapor deposition.

Moreover, this tunnel barrier layer 6 can be obtained by a CVD (chemical vapor deposition) method using organic metals, oxygen, ozone, nitrogen, halogen, halide gas and the like.

In this embodiment, the magnetization free layer 7, in particular, is made of a ferromagnetic material containing CoFeB or CoFeNiB.

According to this arrangement, it becomes possible to decrease the coercive force Hc by increasing the TMR ratio (magnetoresistive ratio). Moreover, it becomes possible to improve the rectangle property of the resistance-magnetic field curve (R-H curve).

Figure 2:
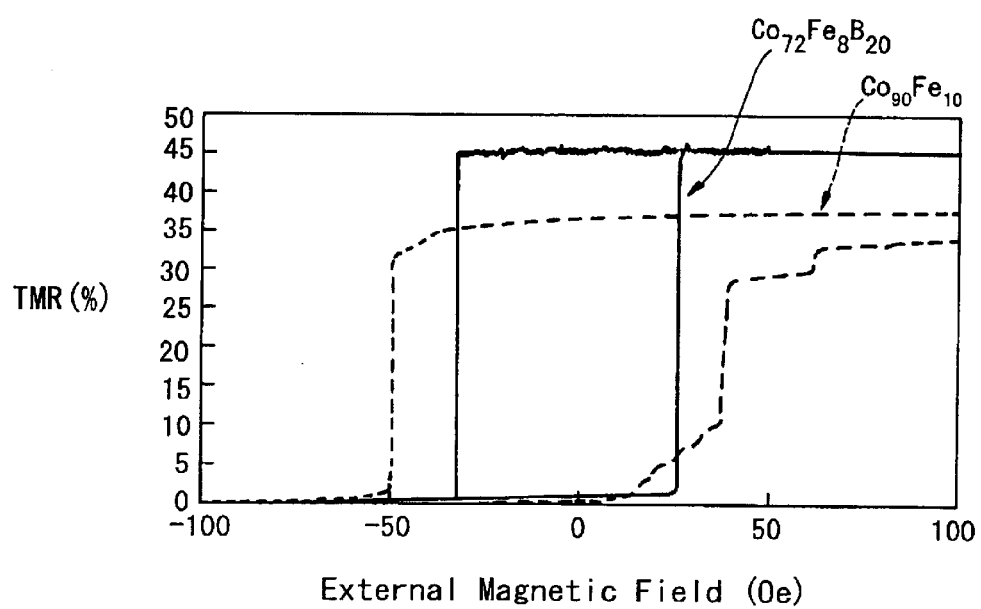
FIG. 2 is a graph showing compared results of resistance-external magnetic field curves of a TMR element obtained when a magnetization free layer is made of a material containing CoFeB and a material containing CoFe.

TMR elements obtained when the magnetization free layer is made of a ferromagnetic material having a composition of Co72Fe8B20 (atomic percent) which falls within a tolerance range of the present invention and the magnetization free layer is made of a ferromagnetic material having a composition of Co90Fe10 (atomic percent) were manufactured in actual practice. FIG. 2 shows measured results of the resistance-external magnetic field curves of these TMR elements thus manufactured. In FIG. 2, a solid line shows the measured result of the resistance-external magnetic field curve of the TMR element made of the material whose composition is Co72Fe8B20. A broken line shows the measured result of the resistance-external magnetic field curve of the TMR element made of the material whose composition is Co90Fe10.

From FIG. 2, it can be understood that the TMR element having the arrangement in which the magnetization free layer is formed of the ferromagnetic material layer containing Fe, Co, B can maintain a high TMR ratio and can decrease the coercive force Hc as compared with the TMR element having the arrangement in which the magnetization free layer is formed of the ferromagnetic material layer containing only Fe and Co. Moreover, it is to be understood from FIG. 2 that the rectangle property of the resistance-external magnetic field curve (R-H curve) can be improved and that the Barkhausen noise also can be decreased.

Therefore, according to the present invention, not only the write current can be decreased but also the shape of the asteroid curve can be improved and the write characteristic can be improved. Thus, it becomes possible to decrease the write error.

The compositions of FeCoB and CoNiB have optimum ranges. As is described in Japanese patent application No. 2002-106926, in the composition of $Fe_xCo_yB_z$ (atomic percent), the composition should preferably be selected in the ranges that can satisfy $5 \leq x \leq 45$, $35 \leq y \leq 85$ and $10 \leq z \leq 30$. Further, in the composition of $Fe_aCo_bNi_cB_d$ (atomic percent), the composition should preferably be selected in the ranges that can satisfy $5 \leq a \leq 45$, $35 \leq b \leq 85$, $0 < c \leq 35$ and $10 \leq d \leq 30$.

Further, in this embodiment, the film thickness of the magnetization free layer 7 is selected to be higher than 2 nm and lower than 8 nm.

By controlling the film thickness of the magnetization free layer 7 so as to fall within the above-mentioned ranges of the film thicknesses, the TMR ratio can be increased and the fluctuation of the coercive force Hc of the magnetization free layer 7 can be decreased. Since the fluctuation of the coercive force Hc of the magnetization free layer 7 can be decreased, the fluctuations of the inverted magnetic field that may invert the magnetization direction of the magnetization free layer 7 can be decreased. Moreover, the magnetization direction of the magnetization free layer 7 can be inverted steeply.

If the film thickness of the magnetization free layer 7 is less than 2 nm, then since the TMR ratio of the TMR element 1 is decreased, the read characteristics of the TMR element 1 obtained when the present invention is applied to the magnetic memory device, for example, are deteriorated.

If the film thickness of the magnetization free layer 7 exceeds 8 nm, then since the magnetization direction of the magnetization free layer 7 is not inverted steeply (responsiveness is degraded), the write operations of the TMR element 1 obtained when the present invention is applied to the magnetic memory device, for example, become imperfect.

According to the arrangement of the TMR element 1 of this embodiment, since the magnetization free layer 7 is made of the ferromagnetic material containing CoFeB or CoFeNiB and the magnetization free layer 7 has the film thickness ranging from 2 nm to 8 nm, a high TMR ratio (magnetoresistive ratio) can be obtained so that the rectangle property of the resistance-magnetic field curve can be improved. Moreover, the coercive force Hc can be decreased and fluctuations of the coercive force Hc can be suppressed, whereby the shape of the asteroid curve of the TMR element 1 can be improved. Furthermore, the magnetization direction of the magnetization free layer 7 can be inverted steeply.

According to this arrangement, when the TMR element 1 is applied to a magnetic memory device including a large number of TMR elements, for example, the shape of the asteroid curve of the TMR element 1 can be improved. Moreover, the magnetization direction of the magnetization free layer 7 can be inverted steeply and the write characteristics can be improved, whereby write errors can be decreased.

When the present invention is applied to a magnetic head and a magnetic sensor including the TMR element, a displacement of an inverted magnetic field from a design value can be suppressed and a yield in the manufacturing process can be increased. Further, it becomes possible to prevent malfunctions.

The present invention is not limited to the TMR element 1 in which the magnetization fixed layer 5 and the magnetization free layer 7 shown in FIG. 1 are respectively formed of single layers.

Figure 3:
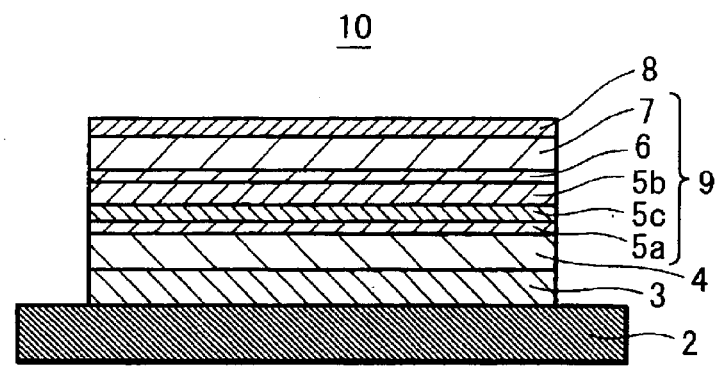
FIG. 3 is a schematic diagram showing an arrangement of a TMR element having a laminated ferri structure.

As shown in FIG. 3, for example, even when the TMR element has a laminated ferri structure in which the magnetization fixed layer 5 has a nonmagnetic conductive layer 5c sandwiched by a first magnetization fixed layer 5a and a second magnetization fixed layer 5b, the effects of the present invention can be achieved.

In the TMR element 10 shown in FIG. 3, the first magnetization fixed layer 5a is coupled to the antiferromagnetic material layer 4 and the first magnetization fixed layer 5a has a strong uniaxial magnetic anisotropy caused by exchange mutual action that acts on these layers. Moreover, since the second magnetization fixed layer 5b becomes the ferromagnetic material layer in which the second magnetization fixed layer 5b is opposed to the magnetization free layer 7 through the tunnel barrier layer 6 and in which the spin direction thereof is compared with the magnetization free layer 7 and is directly concerned with an MR ratio, this second magnetization fixed layer is referred to as a "reference layer".

As a material for use with the nonmagnetic conductive layer 5c having the laminated ferri structure, there may be enumerated Ru, Rh, Ir, Cu, Cr, Au, Ag and the like, for example. In the TMR element 10 shown in FIG. 3, since other layers have arrangements substantially similar to those of the TMR element 1 shown in FIG. 1, they are denoted by the identical reference numerals to those of FIG. 1 and therefore need not be described in detail.

Even in the TMR element 10 having the laminated ferri structure, if the magnetization free layer 7 is made of the ferromagnetic material containing CoFeB or CoFeNiB and the magnetization free layer 7 has the film thickness ranging of from 2 nm to 8 nm, then similarly to the TMR element 1 shown in FIG. 1, a high TMR ratio (magnetoresistive ratio) can be obtained and the rectangle property of the resistance-magnetic field curve can be improved. Moreover, the coercive force Hc can be decreased and the fluctuations of the coercive force Hc can be decreased, whereby the shape of the asteroid curve of the TMR element 10 can be improved. Furthermore, the magnetization direction of the magnetization free layer 7 can be inverted steeply.

While the TMR elements (tunnel magnetoresistive effect elements) 1, 10 are used as the magnetoresistive effect element as described above, the present invention is not limited thereto and can be applied to other magnetoresistive effect element having an arrangement in which a pair of ferromagnetic material layers is opposed to each other through an intermediate layer so that a magnetoresistive effect change can be obtained by causing a current to flow in the direction perpendicular to the layer surface.

The present invention can be applied to a giant magnetoresistive effect element (GMR element) using a nonmagnetic conductive layer such as Cu as an intermediate layer, for example, a giant magnetoresistive effect element having an arrangement in which a magnetoresistive effect can be obtained by causing a current to flow in the direction perpendicular to the layer surface, i.e. so-called CPP (current perpendicular to plane) type GMR element.

Further, the materials of the magnetization fixed layer and the antiferromagnetic material layer, the existence of the antiferromagnetic material layer and the existence of the laminated ferri structure on the side of the magnetization fixed layer may be variously modified so long as the essence of the present invention is not degraded.

The magnetoresistive effect element such as the above-mentioned TMR elements 1, 10 is suitable for use with the magnetic memory device such as the MRAM. The MRAM using the TMR element according to the present invention will be described with reference to the drawings.

Figure 4:
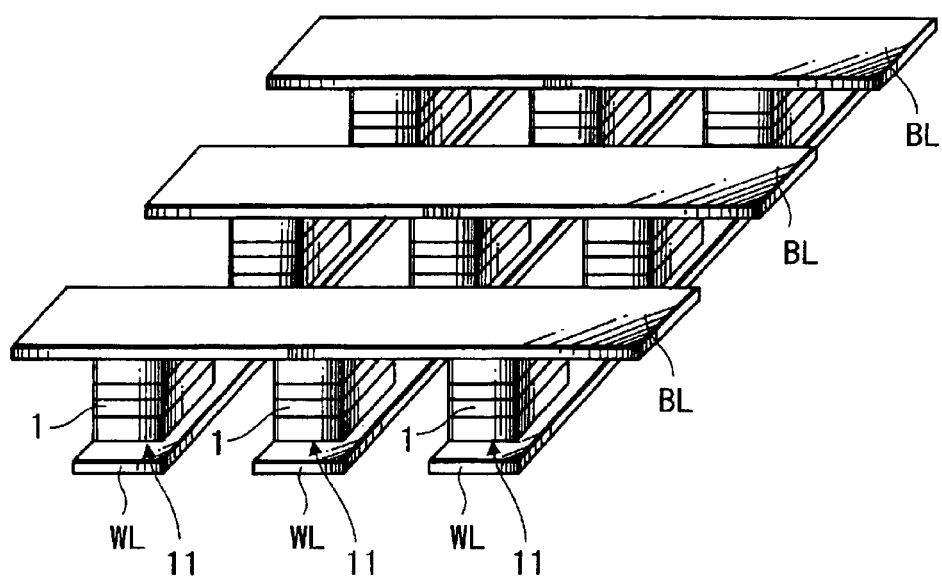
FIG. 4 is a schematic diagram of an arrangement showing a main portion of a crossing-point type MRAM array that includes the inventive TMR element as a memory cell.

FIG. 4 shows a crossing-point type MRAM array which contains TMR elements according to the present invention. This MRAM array includes a plurality of word lines WL and bit lines BL that are intersecting with the word lines and contains memory cells 11 formed by TMR elements according to the present invention which are provided at the intersecting points of the word lines WL and the bit lines BL. Accordingly, 3×3 memory cells are disposed in an XY matrix fashion for this MRAM array.

In the magnetoresistive effect element having the arrangement in which the TMR element for use with the MRAM array is not limited to the TMR element 1 shown in FIG. 1 and may be the TMR element 10 having the laminated ferri structure and the like shown in FIG. 3 for obtaining a magnetoresistive change by causing a current to flow in the direction perpendicular to the layer surface, the magnetoresistive effect element may have any arrangement so long as the magnetization free layer is made of the ferromagnetic material containing CoFeB or CoFeNiB and the magnetization free layer has the film thickness ranging from 2 nm to 8 nm.

Figure 5:
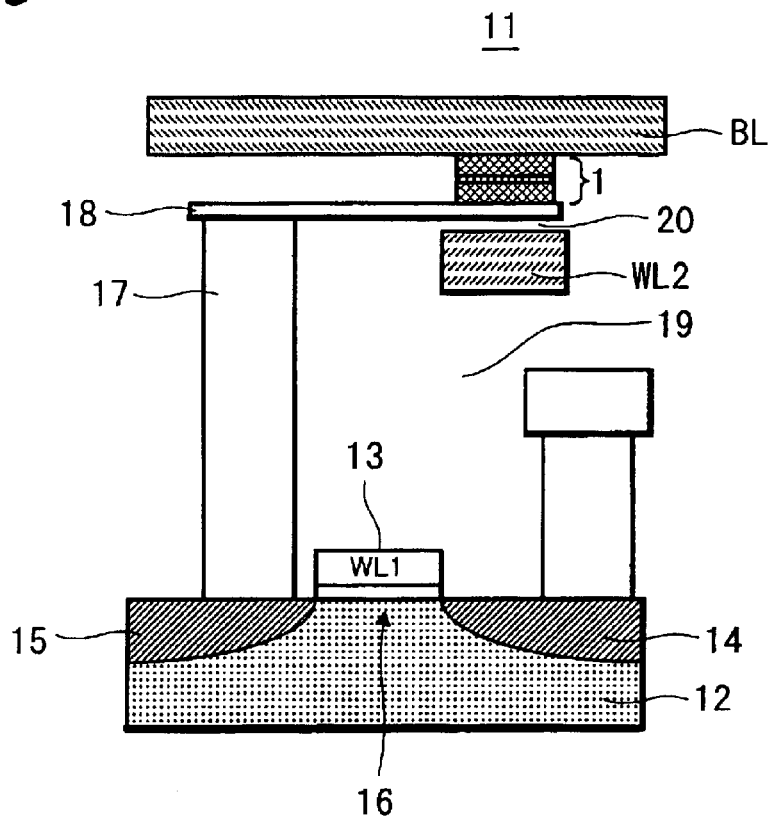
FIG. 5 is a cross-sectional view showing the memory cell in FIG. 4 in an enlarged-scale.

Further, FIG. 5 is a schematic diagram showing an arrangement of a cross-section of a single memory cell portion that is picked up from a plurality of memory cells contained in the memory device.

As shown in FIG. 5, in the respective memory cell portions, a transistor 16 composed of a gate electrode 13, a source region 14 and a drain region 15 is disposed, for example, on a silicon substrate 12. The gate electrode 13 is composed as a word line WL1 for reading. A word line (equivalent to the aforementioned word write line) WL2 for writing is formed on the gate electrode 13 through an insulating layer. A contact metal 17 is connected to the drain region 15 of the transistor 16. Further, an underlayer 18 is connected to the contact metal 17. The TMR element 1 according to the present invention is formed on this underlayer 18 at its position opposing upwardly to the write word line WL2. A bit line (equivalent to the aforementioned bit write line) BL perpendicular to the word lines WL1, WL2 is formed on this TMR element 1. The underlayer 18 is used to electrically connect the TMR element 1 and the drain region 15 which are different in position on the plane and therefore is referred to as a "bypass".

This MRAM includes an interlayer insulating film 19 and an insulating film 20 for insulating the respective word lines WL1, WL2 and the TMR element 1 from each other and a passivation film (not shown) for protecting the whole of the MRAM.

Since this MRAM uses the TMR element 1 having the arrangement in which the magnetization free layer 7 is made of the ferromagnetic material containing CoFeB or CoFeNiB and the film thickness of the magnetization free layer falls within the above-mentioned specific range, this MRAM can obtain an extremely excellent TMR output and stability of memory operation can be improved considerably. Further, in the resistance-magnetic field curve (R-H curve), since noises can be decreased, the coercive force can be made uniform and the asteroid characteristic can be improved, write errors can be decreased. Further, since the magnetization direction of the magnetization free layer 7 can be inverted steeply, write operations become perfect.

Specifically, the read characteristic and the write characteristic can be satisfied at the same time.

INVENTIVE EXAMPLES

Specific inventive examples to which the present invention is applied will be described with reference to the experimental results.

Figure 6:
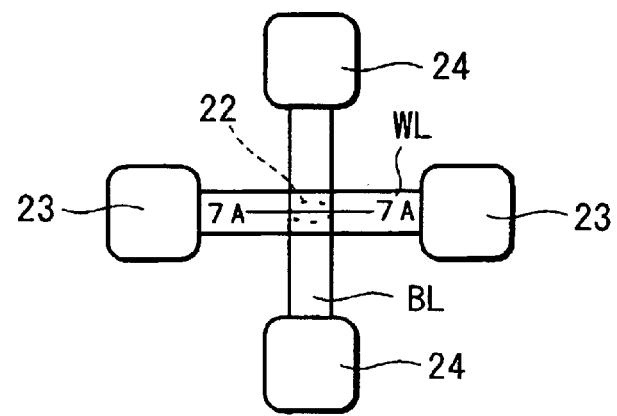
FIG. 6 is a plan view of a TEG for use in evaluating the TMR element.
Figure 7:
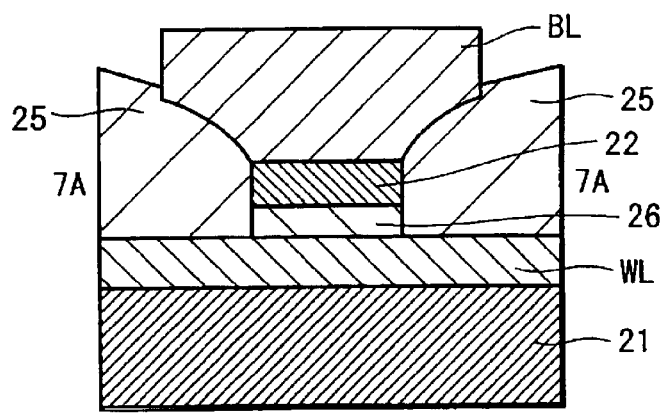
FIG. 7 is a cross-sectional view taken along the line 7A—7A in FIG. 6.

Although the MRAM includes the switching transistor 16 other than the TMR element 1 as shown in FIG. 5, according to the inventive examples, characteristics of a wafer in which only a ferromagnetic tunnel junction is formed as shown in FIGS. 6 and 7 had been measured and evaluated.

Then, effects exerted upon the TMR ratio and the magnetic characteristics by the film thickness of the magnetic free layer made of the material containing FeCoB or FeCoNiB were examined.

FIG. 6 is a plan view and FIG. 7 is a cross-sectional view taken along the line 7A—7A in FIG. 6. As shown in FIGS. 6 and 7, as a characteristic evaluation element TEG (Test Element Group), there was manufactured a structure in which a word line WL and a bit line BL are crossed on a substrate 21 and in which a TMR element 22 is formed on a portion in which these word line WL and bit line BL are crossing each other. In this TEG, the TMR element 22 is shaped like an ellipse. Terminal pads 23, 24 are formed at respective ends of the word line WL and the bit line BL, and the word line WL and the bit line BL are electrically insulated from each other by insulating films 25, 26, each of which is made of $Al_2O_3$.

There were manufactured three ellipse-like TMR elements 22 having dimensions of minor-axis is 0.6 mm×major-axis 1.2 mm, minor-axis 0.8 mm×major-axis 1.6 mm and minor-axis 2.0 mm×major-axis 4.0 mm.

The manner in which the TEG shown in FIGS. 6 and 7 was manufactured will be described more fully below.

First, there was prepared a 0.6 mm-thick silicon substrate 21 on which surface there was formed a heat oxide film (having a thickness of 2 nm).

Next, after a material of a word line has been deposited on the substrate 21 and the material of the word line deposited on the silicon substrate 21 has been masked by photolithography, other portions than the word line were selectively etched away by Ar (argon) ion plasma laser and thereby the word line WL was formed. At that time, other areas than the word line WL were etched away up to the depth of 5 nm of the silicon substrate 21.

Thereafter, the insulating film 26 was formed on the surface so as to cover the word line WL and the surface is made flat by planarization.

Subsequently, the TMR element 22 having the following layer arrangement (1) was manufactured by well-known lithography and etching. In the layer arrangement (1), the left-hand side portions of slashes show the sides of the substrate and numerical values in parentheses show film thicknesses.

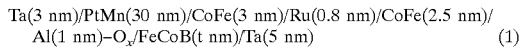

Ta(3 nm)/PtMn(30 nm)/CoFe(3 nm)/Ru(0.8 nm)/CoFe(2.5 nm)/ Al(1 nm)-$O_x$/FeCoB(t nm)/Ta(5 nm)    (1)

In the above-described layer arrangement (1), the composition of FeCoB comprising the magnetization free layer was selected to be Fe8Co72B20 (atomic percent) or Fe20Co60B20 (atomic percent).

The composition of each CoFe film was selected to be Co75Fe25 (atomic percent).

The Al—$O_x$ film in the tunnel barrier layer 6 was formed in such a manner that after a metal Al film having a thickness of 1 nm has been deposited by DC sputtering, the metal Al film was oxidized by plasma ion laser produced from ICP (induced coupling plasma) under the condition in which a flow rate of oxygen/argon ion gas was selected to be 1:1 and pressure of chamber gas was selected to be 0.1 mTorr. The oxidation time can be varied depending upon ICP plasma output and was selected to be 30 seconds in this inventive example.

Other films than the Al—$O_x$ film of the tunnel barrier layer 6 were deposited by DC magnetron sputtering.

Next, the resultant sample was annealed by rotating field anneal within the rotating annealing furnace in the magnetic field of 10 kOe at 265° C. for four hours. Then, a PtMn layer that is the antiferromagnetic material layer is regulated and annealed and thereby the ferromagnetic tunnel junction 9 was formed.

Subsequently, the TMR element 22 having the plane pattern shown in FIG. 6 was formed by patterning the TMR element 22 and the insulating film 26 formed under the TMR element 22.

Further, the insulating film 25 having a thickness of approximately 100 nm was deposited by sputtering $Al_2O_3$. Furthermore, the bit line BL and the terminal pad 24 were formed by photolithography and the TEG shown in FIGS. 6 and 7 were obtained.

Then, the R-H curve of the TEG of the thus manufactured sample was measured and the TMR ratio, the fluctuations of the coercive force and the rectangle ratios were measured from the resultant R-H curve.

Measurement of R-H Curves

In the ordinary magnetic memory device such as the MRAM, information may be written by inverting the magnetization direction of a magnetoresistive effect element with application of a current magnetic field. In the inventive example, the magnetoresistive effect element was magnetized with application of external magnetic fields and resistance values thereof were measured. Specifically, first, external magnetic fields (inverting magnetic fields) for inverting the magnetization direction of the magnetization free layer of the TMR element 22 were applied to the magnetization free layer in parallel to the easy axis of magnetization of the magnetization free layer. The magnitude of the external magnetic field for measurement was selected to be 100 Oe.

Next, at the same time the magnetization free layer was swept in a range of from −100 Oe to +100 Oe as seen from one side of the easy axis of magnetization of the magnetization free layer, a tunnel current is caused to flow through the ferromagnetic tunnel junction while a bias voltage applied to the terminal pad 23 of the word line WL and the terminal pad 24 of the bit line BL is being adjusted to reach 100 mV. Then, the R-H curves were obtained by measuring resistance values against respective external magnetic fields obtained at that time.

TMR Ratio

Resistance values obtained in the condition in which the magnetizations of the magnetization fixed layer and the magnetization free layer are anti-parallel and resistance values are high and resistance values obtained in the condition in which the magnetizations of the magnetization fixed layer and the magnetization free layer are parallel to each other and resistance values are low were measured and TMR ratios (magnetoresistive changing ratio) were measured from these measured resistance values.

From the standpoint for obtaining satisfactory read characteristics, the TMR ratio should preferably be greater than 45%.

Fluctuation of Coercive Force Hc

The R-H curves were measured by the above-described measurement method. Then, mean values between resistance values measured in the condition in which magnetizations of the magnetization fixed layer and the magnetization free layer are in the anti-parallel state and in which resistance values are high and resistance values measured in the condition in which magnetizations of the magnetization fixed layer and the magnetization free layer are parallel to each other and in which resistance values are low were measured from the R-H curves thus obtained, and a value of an external magnetic field obtained when the resistance value of this mean value is obtained was determined as a coercive force Hc. This coercive force Hc was obtained from all elements (TEGs) within the wafers and a mean value and a standard deviation . was obtained. Then, ./(mean value of Hc) was determined as a value of fluctuation of the coercive force Hc.

From a standpoint of improving write characteristics, the fluctuation of the coercive force Hc should preferably be selected to be less than 10%.

Figure 8:
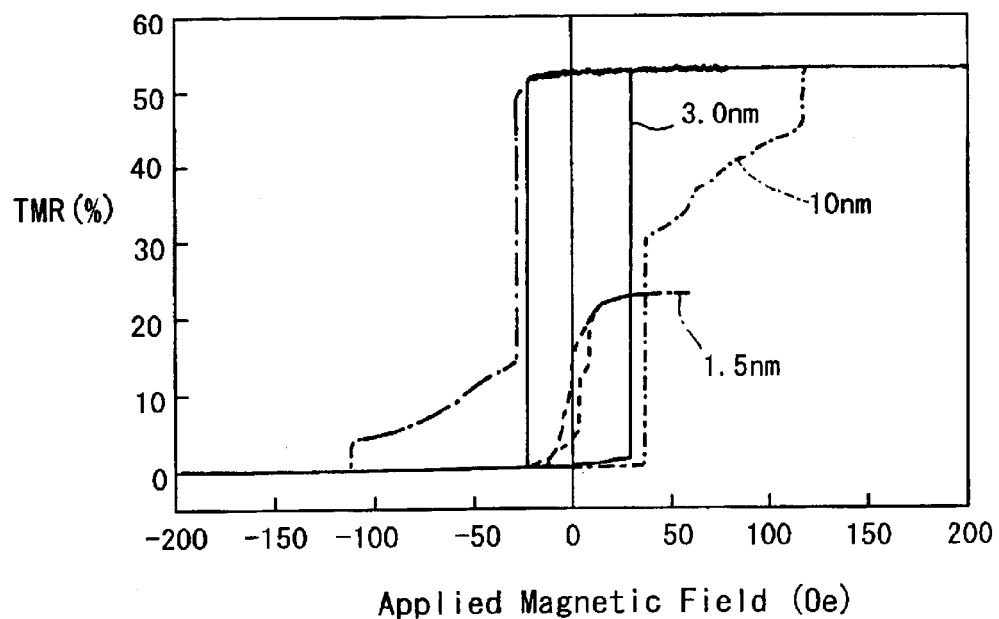
FIG. 8 is a graph showing measured results of resistance-magnetic field curves obtained when the film thickness of the magnetization free layer is changed.

FIG. 8 shows resistance-magnetic field curves (R-H curves) obtained when the composition of the magnetization free layer was Fe8Co72B20 (atomic percent), the size of the TMR element 22 was selected to be 0.8×1.6 mm² and the film thickness t of the magnetization free layer was changed to 5 nm, 3 nm and 10 nm, respectively. The vertical axis shows a ratio (%) in which a resistance vale is changed by a tunnel magnetoresistive effect (TMR) instead of the resistance value.

As shown in FIG. 8, when the film thickness t of the magnetization free layer is equal to 3 nm, a high TMR ratio and a steep inversion of magnetization are realized. Although not shown, when the thickness t of the magnetization free layer falls within a range of 2 nm≦t≦8 nm, such ideal R-H curve was observed.

When the thickness of the magnetization free layer is smaller than 2 nm, for example, t=1.5 nm, the TMR ratio was decreased to 20%. The reason for this is that the magnetization free layer cannot be magnetized sufficiently.

Further, when the thickness of the magnetization free layer is greater than 8 nm, for example, t=10 nm, it is to be understood that, although the TMR ratio is held at a high value, the magnetization is inverted at two steps and the second inversion of the magnetization is very gentle.

In the magnetic memory device such as the MRAM, the magnetization direction should be inverted rapidly in order to selectively write information. Having considered this point, it is to be understood that it is disadvantageous to increase the thickness of the magnetization free layer more than 8 nm.

Figure 9A:
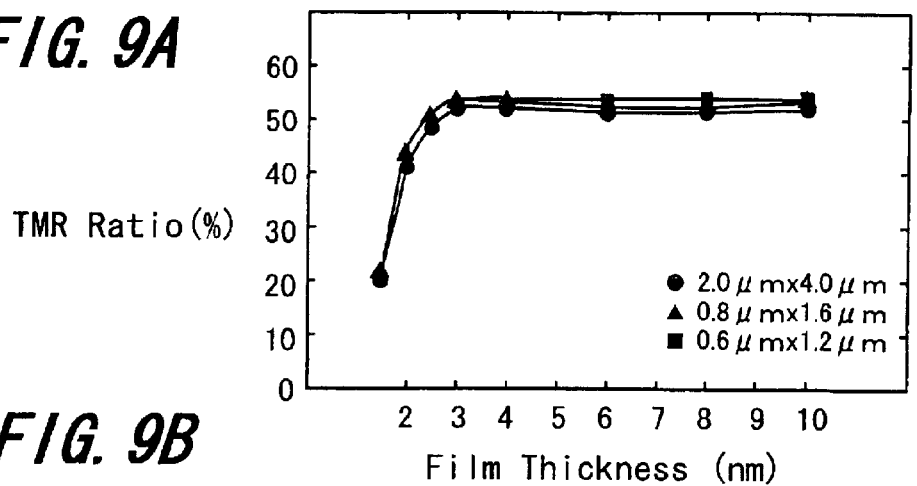
Figure 9B:
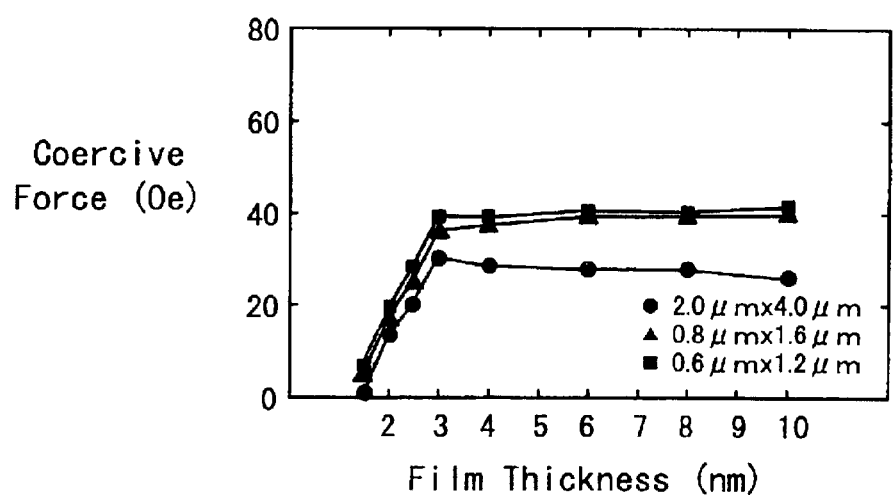
Figure 9C:
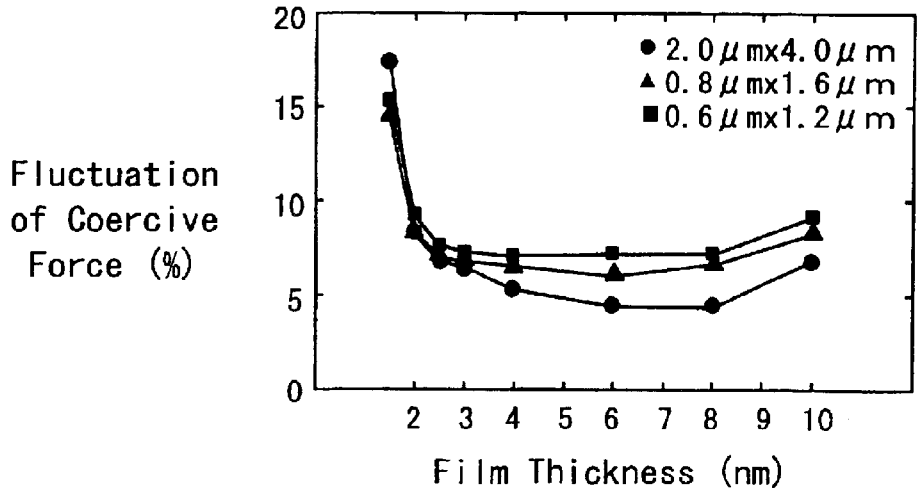

Subsequently, FIGS. 9A, 9B and 9C show relationships among the film thickness of the magnetization free layer, the TMR ratio, the mean value of the coercive force Hc and the fluctuations of the coercive force Hc obtained when the composition of the magnetization free layer was selected to be Fe8Co72B20 (atomic percent) and the film thickness t of the magnetization free layer was changed to 1.5 nm, 2 nm, 2.5 nm, 3 nm, 4 nm, 6 nm, 8 nm, 10 nm, respectively.

Figure 10A:
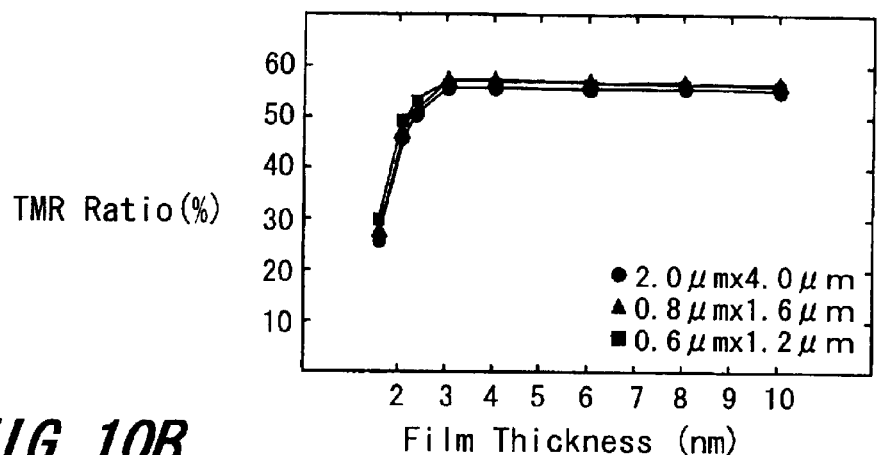
Figure 10B:
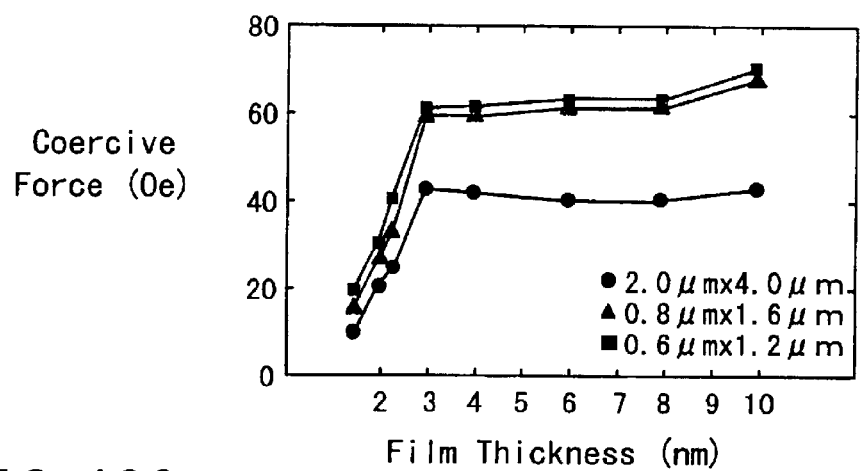
Figure 10C:
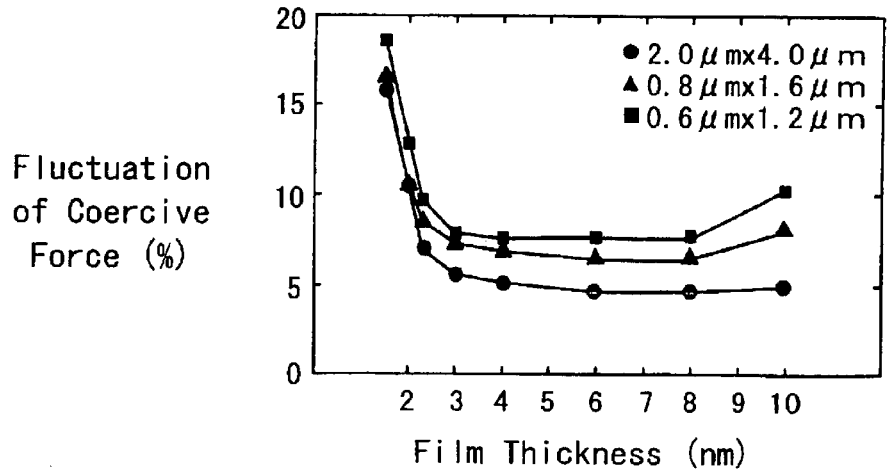

FIGS. 10A, 10B and 10C show relationships among the film thickness of the magnetization free layer, the TMR ratio, the mean value of the coercive force Hc and the fluctuations of the coercive force Hc obtained when the composition of the magnetization free layer was selected to be Fe20Co60B20 (atomic percent) and the film thickness t of the magnetization free layer was changed similarly to FIGS. 9A to 9C, respectively.

As shown in FIGS. 9A and 10A, in the case of any composition of the magnetization free layer, the TMR ratio was increased to be greater than 45% which is a value available in actual practice when the film thickness of the magnetization free layer was greater than 2 nm. When the film thickness of the magnetization free layer was approximately 3 nm, the magnetization free layer was saturated at 54% if the composition of the magnetization free layer was Fe8Co72B20 (atomic percent), and the magnetization free layer was saturated at 57% if the composition of the magnetization free layer was Fe20Co60B20 (atomic percent), respectively.

From FIGS. 9B and 10B, it is to be understood. that when the film thickness of the magnetization free layer falls within a range of from 2 nm to 3 nm, the coercive force Hc (mean value) increases monotonically with the film thickness. In this range, the film thickness of the magnetization free layer can be adjusted in order to obtain a necessary coercive force Hc. When the film thickness of the magnetization free layer becomes greater than 3 nm, the inverted magnetic field Hc hardly increases similarly to the TMR ratio.

However, it is to be noted that when the film thickness of the magnetization free layer is greater than 8 nm, the inversion of the magnetization is not steep.

Further, from FIGS. 9C and 10C, it becomes clear that the fluctuations of the coercive force Hc are extremely small depending upon the element size, i.e. in very small elements (solid circles in the respective sheets of drawings) when the film thickness of the magnetization free layer is approximately 4 nm. Also, it is to be understood that when the film thickness of the magnetization free layer is less than 2 nm or this film thickness exceeds 8 nm, the fluctuations of the coercive force increase rapidly.

From the above-mentioned results, it is to be understood that when the film thickness of the magnetization free layer is selected to be greater than 2 nm and smaller than 8 nm, the magnetic characteristics of the TMR element 22 become satisfactory. Accordingly, it became clear that the write characteristic and the read characteristic were considerably improved when the present invention is applied to the magnetic memory device such as the MRAM.

While the magnetization free layer is made of the ferromagnetic material containing FeCoB as described above, when the magnetization free layer is made of the ferromagnetic material containing FeCoNiB, if the film thickness of the magnetization free layer is selected to be greater than 2 nm and smaller than 8 nm, then the magnetic characteristic of the TMR element 22 become satisfactory similarly. When the present invention is applied to the magnetic memory device such as the MRAM, the write characteristic and the read characteristic are improved considerably.

The magnetoresistive effect element (TMR element and the like) according to the present invention is not limited to the aforementioned magnetic memory device and can be applied to a magnetic head, a hard disk drive having this magnetic head mounted thereon, a magnetic sensor, an integrated circuit chip and various electronic devices such as personal computers, personal digital assistants and mobile phones and electronic devices.

According to the magnetoresistive effect element of the present invention, the magnetoresistive changing ratio (magnetoresistive ratio) can be increased, the rectangle property of the resistance-magnetic field curve can be improved, the steep inversion of the magnetization can be improved and the fluctuations of the coercive force can be improved.

Accordingly, it is possible to construct the magnetoresistive effect element that may have satisfactory magnetic characteristics stably.

Thus, when the magnetoresistive effect element is applied to the magnetic memory device, the write error and the read error can be decreased and excellent write characteristic and read characteristic can be obtained.

Further, according to the magnetic memory device of the present invention, it is possible to construct the magnetic memory device which has very lesser write errors and read errors, which has excellent write characteristic and read characteristic and which can operate stably.

Having described a preferred embodiment of the invention with reference to the accompanying drawings, it is to be understood that the invention is not limited to that precise embodiment and that various changes and modifications could be effected therein by one skilled in the art without departing from the scope of the invention as defined in the appended claims.

What is claimed is:

1. A magnetic memory device, comprising:
   a magnetoresistive effect element designed in such a manner that a ferromagnetic tunnel junction sandwiching a tunnel barrier layer is formed between a pair of ferromagnetic material layers to cause a current to flow in the direction perpendicular to the layer surface;
   a plurality of word lines; and
   a plurality of bit lines, said word lines and bit lines sandwiching said magnetoresistive effect element in the thickness direction,
   wherein one of said ferromagnetic material layers is a magnetization fixed layer and the other ferromagnetic material layer is a magnetization free layer, said magnetization free layer is made of a ferromagnetic material containing $Fe_xCo_yB_z$, x is from 5 to 45 atomic percent, y is from 35 to 85 atomic percent, and z is from 10 to 30 atomic percent, and
   wherein said magnetization free layer has a film thickness ranging from 2 nm to 8 nm.

2. A magnetic memory device according to claim 1, wherein said tunnel barrier layer is made of one of an insulating or semiconductor material.

3. A magnetic memory device according to claim 1, wherein said magnetoresistive effect element has a laminated ferri structure.

4. A magnetic memory device according to claim 1, wherein x is greater than 8 atomic percent.

5. A magnetic memory device according to claim 1, wherein y is less than 72 atomic percent.

6. A magnetic memory device according to claim 1, wherein said tunnel barrier layer is made of one of an insulating or semiconductor material.

7. A magnetic memory device according to claim 1, wherein said magnetoresistive effect element has a laminated ferri structure.

8. A magnetic memory device, comprising:
   a magnetoresistive effect element designed in such a manner that a ferromagnetic tunnel junction sandwiching a tunnel barrier layer is formed between a pair of ferromagnetic material layers to cause a current to flow in the direction perpendicular to the layer surface;
   a plurality of word lines; and
   a plurality of bit lines, said word lines and bit lines sandwiching said magnetoresistive effect element in the thickness direction,
   wherein one of said ferromagnetic material layers is a magnetization fixed layer and the other ferromagnetic material layer is a magnetization free layer, said magnetization free layer is made of a ferromagnetic material containing $Fe_aCo_bNi_cB_d$, a is from 5 to 45 atomic percent, b is from 35 to 85 atomic percent, c is greater than 0 and less than 35 atomic percent, and d is from 10 to 30 atomic percent, and
   wherein said magnetization free layer has a film thickness ranging from 2 nm to 8 nm.

* * * * *